United States Patent
Ota et al.

(10) Patent No.: US 11,665,928 B2
(45) Date of Patent: May 30, 2023

(54) OPTICAL MODULE AND IMAGE DISPLAY DEVICE

(71) Applicant: SEIKO EPSON CORPORATION, Tokyo (JP)

(72) Inventors: Hitoshi Ota, Shiojiri (JP); Tsuyoshi Tamura, Hara-Mura Suwa-gun (JP); Shinichi Iwata, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/705,412

(22) Filed: Mar. 28, 2022

(65) Prior Publication Data

US 2022/0310715 A1 Sep. 29, 2022

(30) Foreign Application Priority Data

Mar. 29, 2021 (JP) .............................. JP2021-055153

(51) Int. Cl.
*G09G 5/00* (2006.01)
*H01L 27/32* (2006.01)
*G02B 27/01* (2006.01)
*H01L 51/52* (2006.01)

(52) U.S. Cl.
CPC ...... *H01L 27/3225* (2013.01); *G02B 27/0172* (2013.01); *H01L 27/3216* (2013.01); *H01L 27/3218* (2013.01); *H01L 51/5271* (2013.01); *G02B 2027/0178* (2013.01)

(58) Field of Classification Search
CPC ............. H01L 27/3225; H01L 27/3216; H01L 27/3218; H01L 51/5271; G02B 27/0172; G02B 2027/0178

USPC ............................................................ 345/7
See application file for complete search history.

(56) References Cited

U.S. PATENT DOCUMENTS

| | | | |
|---|---|---|---|
| 2006/0274090 A1 | 12/2006 | Koyama et al. | |
| 2008/0043125 A1* | 2/2008 | Kozlowski | H01L 27/14621 348/E9.01 |
| 2013/0234917 A1 | 9/2013 | Lee | |
| 2016/0351116 A1 | 12/2016 | Sun | |
| 2020/0089012 A1* | 3/2020 | Koshihara | G02B 27/141 |
| 2020/0357864 A1* | 11/2020 | Xiao | H01L 27/3218 |

(Continued)

FOREIGN PATENT DOCUMENTS

| | | |
|---|---|---|
| JP | 2013187187 | 9/2013 |
| JP | 2017027082 | 2/2017 |

(Continued)

*Primary Examiner* — Jennifer T Nguyen
(74) *Attorney, Agent, or Firm* — JCIPRNET

(57) ABSTRACT

An optical module includes a first electro-optical device including a first pixel, a second electro-optical device including a second pixel and a third pixel, and a prism. An area of the second pixel is larger than an area of the first pixel, and an area of the third pixel is smaller than the area of the second pixel. A width of the third pixel in a direction corresponding to a first direction in a synthesized image is not less than 0.5 times and less than 1 time a width of the first pixel in the direction corresponding to the first direction, and a width of the third pixel in a direction corresponding to a second direction in the synthesized image is 0.5 times or more and less than 1 time a width of the first pixel in the direction corresponding to the second direction.

13 Claims, 10 Drawing Sheets

(56) References Cited

U.S. PATENT DOCUMENTS

2021/0175300 A1* 6/2021 Kim .................... H01L 51/5253
2021/0257438 A1* 8/2021 Cho .................... H01L 27/3223

FOREIGN PATENT DOCUMENTS

JP          2018503848       2/2018
JP          2020046529       3/2020

* cited by examiner

OPTICAL MODULE AND IMAGE DISPLAY DEVICE

The present application is based on, and claims priority from JP Application Serial Number 2021-055153, filed Mar. 29, 2021, the disclosure of which is hereby incorporated by reference herein in its entirety.

BACKGROUND

1. Technical Field

The present disclosure relates to optical modules and image display devices.

2. Related Art

Optical modules provided with a plurality of electro-optical devices each emitting light of a particular color and a prism that synthesizes the lights emitted from the respective electro-optical devices have been known as image generation units for image display devices such as head-mounted displays and projectors.

JP 2020-46529 A discloses an image display module provided with a first display panel including a first pixel emitting a first color light, a second display panel including a second pixel emitting a second color light and a third pixel emitting a third color light, and a dichroic prism synthesizing the three colored lights.

JP 2020-46529 A states that in the second display panel, by making an area of the second pixel using a light-emitting material with a short lifespan larger than an area of the third pixel using a light-emitting material with a long lifespan, the lifespan of the light-emitting material used in the second pixel can be extended, thereby ensuring the lifespan of the entire image display module. As a specific example of how to make the area of the second pixel different from the area of the third pixel, an example is disclosed in which the shapes of the second pixel and the third pixel are rectangular, and the lengths of short sides of the respective rectangles are different form each other.

The manufacturing process for this type of optical module includes a step of bonding a plurality of panels to the prism. However, in this bonding step, the bonding position of each panel to the prism may shift. When an optical module in which the panel is bonded misaligned to the prism is used as a component of an image display device, the display quality of the image may deteriorate.

SUMMARY

In order to solve the above problem, an optical module according to one aspect of the present disclosure includes a first electro-optical device including a first pixel configured to emit light having a first wavelength region, a second electro-optical device including a second pixel configured to emit light having a second wavelength region and a third pixel configured to emit light having a third wavelength region, and a prism configured to synthesize image light emitted from the first electro-optical device and image light emitted from the second electro-optical device. An area of the second pixel is larger than an area of the first pixel, and an area of the third pixel is smaller than the area of the second pixel. In an image formed by synthesizing the image lights by the prism, a first width of the third pixel in a direction corresponding to a first direction is not less than 0.5 times and less than 1 time a second width of the first pixel in the direction corresponding to the first direction, and a third width of the third pixel in a direction corresponding to a second direction intersecting the first direction is not less than 0.5 times and less than 1 time a fourth width of the first pixel in the direction corresponding to the second direction.

In addition, an image display device according to another aspect of the present disclosure includes the optical module according to the one aspect of the present disclosure.

DESCRIPTION OF EXEMPLARY EMBODIMENTS

First Embodiment

A first embodiment of the present disclosure will be described below using FIGS. 1 to 10.

Figure 1:
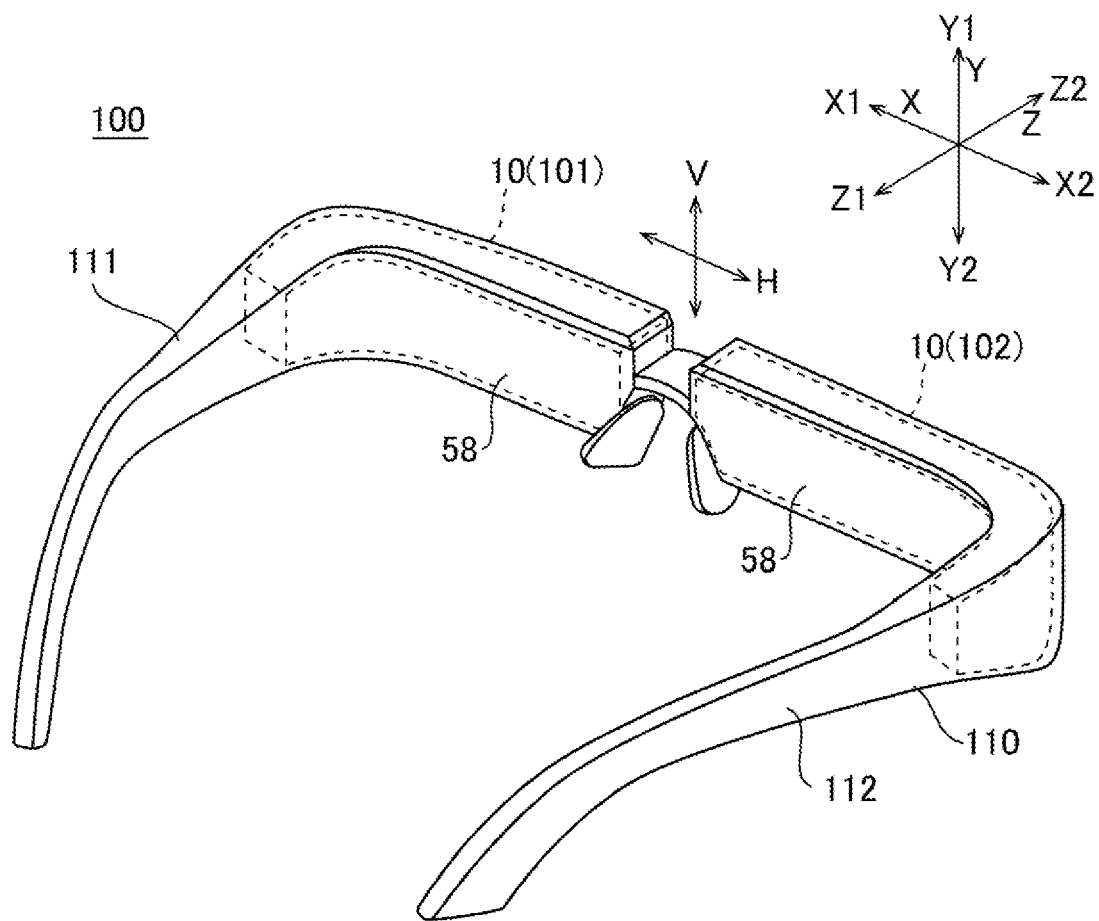
FIG. 1 is a schematic configuration diagram illustrating a head-mounted display according to a first embodiment.

FIG. 1 is a perspective view illustrating a schematic configuration of an image display device according to the first embodiment.

Note that, in the drawings, the dimensions of some components may be scaled differently for ease of understanding for the components.

As illustrated in FIG. 1, an image display device 100 according to the first embodiment is configured as a head-mounted display such as a see-through eyeglass display, and includes a frame 110 provided with left and right temples 111 and 112. In the image display device 100, a display unit 10, to be described later, is supported by the frame 110. The image display device 100 allows a user to recognize an image emitted by the display unit 10 as a virtual image. In the embodiment, the image display device 100 includes the display unit 10 including a left-eye display unit 101 and a right-eye display unit 102. The left-eye display unit 101 and the right-eye display unit 102 have the same configuration and are arranged left-right symmetrically.

In the following description, the left-eye display unit 101 will be mainly described, and the description for the right-eye display unit 102 will be omitted. In the following description, the right-left direction is defined as a first direction X, the front-rear direction is defined as a second direction Z, and the up-down direction is defined as a third direction Y, when viewed from the user. Further, one side (left side) in the first direction X is represented by X1, the other side (right side) in the first direction X is represented by X2, one side (rear side) in the second direction Z is represented by Z1, the other side (front side) in the second direction Z is represented by Z2, one side (upper side) in the third direction Y is represented by Y1, and the other side (lower side) in the third direction Y is represented by Y2. Here, the left-eye display unit 101 and the right-eye display unit 102 are symmetrically arranged, and thus, in the display unit 102, the relationship between the one side X1 and the other side X2 in the first direction X is horizontally reversed in comparison to that in the display unit 101.

Overall Configuration of Display Unit

Figure 2:
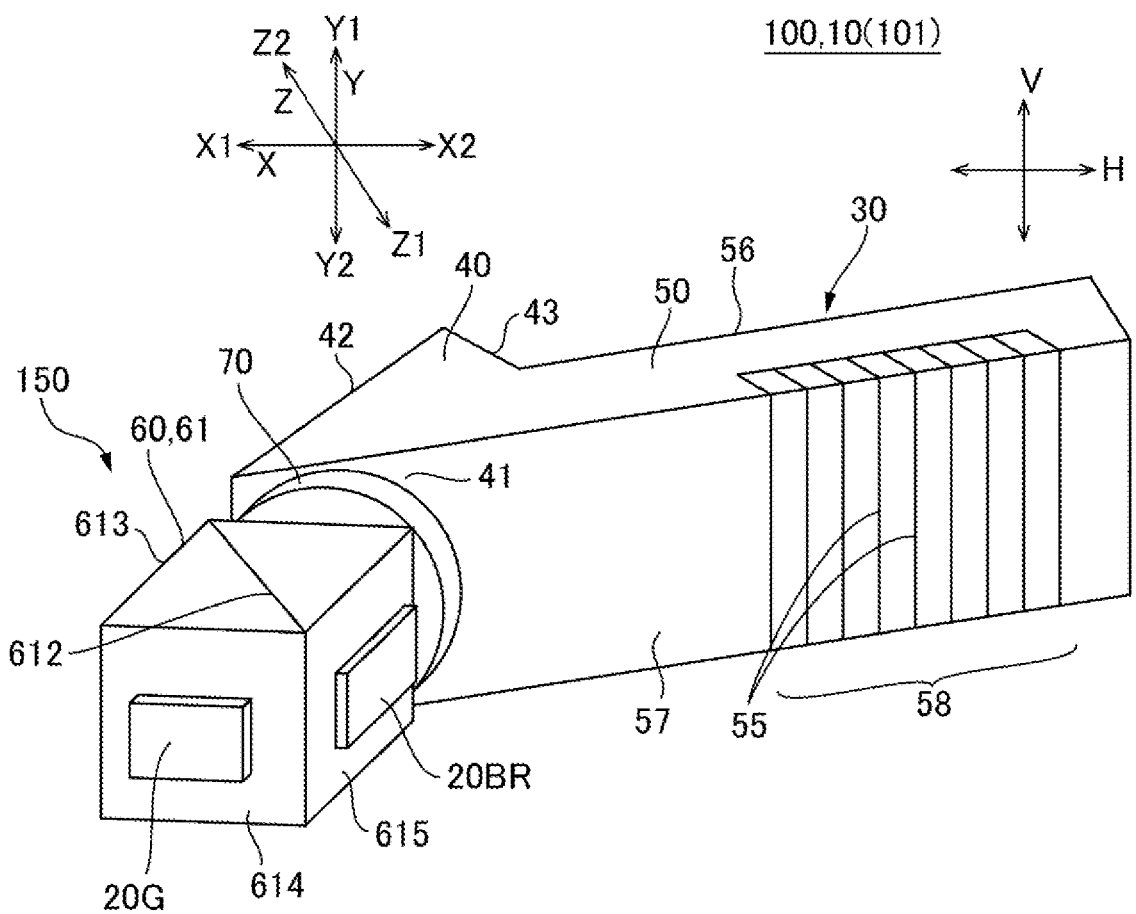
FIG. 2 is a perspective view schematically illustrating an optical system of a virtual image display unit.
Figure 3:
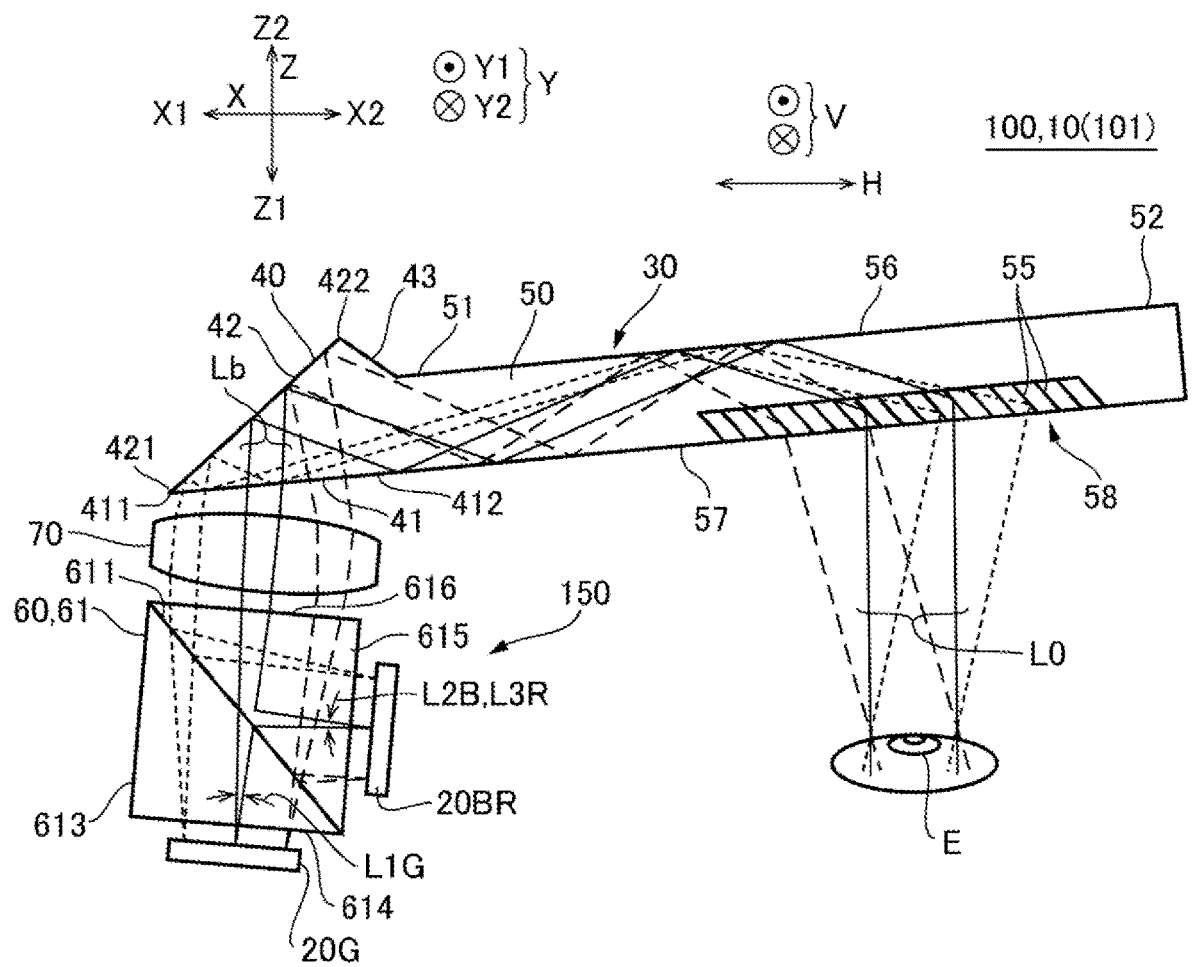
FIG. 3 is a diagram illustrating optical paths of the optical system.

FIG. 2 is a perspective view schematically illustrating a configuration of an optical system of the display unit 10 illustrated in FIG. 1. FIG. 3 is a view of the display unit 10 illustrated in FIG. 2 as viewed from the third direction Y. Note that, in FIGS. 2 and 3, portions corresponding to red light, green light, and blue light are denoted by R, G, and B, respectively. In addition, of the colored lights L emitted from panels 20G and 20BR, only effective light fluxes that enter an eye E of an observer as image light LO are illustrated. Further, as the effective light fluxes, the effective light fluxes emitted from the pixels at the centers of the panels 20G and 20BR are represented by solid lines, the effective light fluxes emitted from the pixels at one edges of the panels 20G and 20BR are represented by long dashed lines, and the effective light fluxes emitted from the pixels at the other edges of the panels 20G and 20BR are represented by short dashed lines.

As illustrated in FIGS. 2 and 3, the display unit 10 (left-eye display unit 101) of the image display device 100 includes an optical module 150 that emits the synthesized light LO in which a plurality of colored lights are synthesized, and a light-guiding optical system 30 that guides the synthesized light LO emitted from the optical module 150, to an emitting part 58. The optical module 150 includes the panels 20G and 20BR and a prism 60 that synthesizes the colored lights emitted from the panels 20G and 20BR. A projection optical device 70 is provided between the prism 60 and the light-guiding optical system 30. The synthesized light LO emitted from the prism 60 enters the light-guiding optical system 30 via the projection optical device 70. The projection optical device 70 is configured by a single collimating lens having a positive power.

The light-guiding optical system 30 includes a transmissive incidence part 40 that receives the synthesized light LO, and a transmissive light-guiding part 50 coupled to the incidence part 40 on an end 51 side in the first direction X. In the embodiment, the incidence part 40 and the light-guiding part 50 are formed as a single light transmissive member.

The incidence part 40 has an incident surface 41 for receiving the synthesized light LO emitted from the prism 60, and a reflection surface 42 for reflecting, toward the incident surface 41, the synthesized light LO that has entered from the incident surface 41. The incident surface 41 is a flat surface, an aspherical surface, a free form surface, or the like, facing the one side Z1 in the second direction Z, and faces the prism 60 with the projection optical device 70 interposed between the incident surface 41 and the prism 60.

The projection optical device 70 is disposed obliquely such that the distance between the projection optical device 70 and an end 412 of the incident surface 41 on the other side X2 in the first direction X is larger than the distance between the projection optical device 70 and an end 411 of the incident surface 41 on the one side X1 in the first direction. The incident surface 41 does not include a reflection film or the like formed thereon. However, the incident surface 41 fully reflects light that is incident at an incident angle equal to or greater than a critical angle. Thus, the incident surface 41 is light-transmissive and light-reflective.

The reflection surface 42 is configured by a surface located on the other side Z2 in the second direction Z to the incident surface 41. The reflection surface 42 includes an end 422 on the other side X2 in the first direction X and an end 421 on the one side X1 in the first direction X, and is obliquely provided so that the end 422 is positioned farther from the incident surface 41 than the end 421. Thus, the incidence part 40 has a substantially triangular shape, as viewed from the third direction Y.

The reflection surface 42 is configured by a flat surface, an aspherical surface, a free form surface, or the like. The reflection surface 42 may not include a reflection film or the like formed thereon, and may be configured to fully reflect light that is incident at an incident angle equal to or greater than a critical angle. Alternatively, the reflection surface 42 may have a configuration in which a reflective metal layer, mainly made of aluminum, silver, magnesium, chrome, or the like, is formed.

The light-guiding part 50 includes a first surface 56 (first reflection surface) that extends, in the first direction X, from the end 51 on the one side X1 to an end 52 on the other side X2, a second surface 57 (second reflection surface) that extends from the end 51 to the end 52 in the first direction X, and the emitting part 58 provided apart from the incidence part 40 at a part of the second surface 57. The second surface 57 faces the first surface 56 in parallel with the first surface 56 on the one side Z1 in the second direction Z.

The first surface 56 and the reflection surface 42 are formed as a continuous surface with an oblique surface 43 interposed between the first surface 56 and the reflection surface 42. The thickness between the first surface 56 and the second surface 57 in the second direction Z, that is, the dimension of the light-guiding part 50 in the second direction Z, is less than the dimension of the incidence part 40 in the second direction Z. The first surface 56 and the second surface 57 fully reflect light incident on the first surface 56 and the second surface 57 at an incident angle equal to or greater than a critical angle, based on a refractive index difference between the light-guiding part 50 and the air, which is the atmosphere. Thus, the first surface 56 and the second surface 57 do not include a reflection film or the like formed thereon.

The emitting part 58 is formed on a part of the light-guiding part 50 on the second surface 57 side. In the emitting part 58, a plurality of partial reflection surfaces 55 extending parallel to each other are arranged along the first direction X. Each of the plurality of partial reflection surfaces 55 is angled toward the one side X1 in the first direction X with respect to the normal direction of the second surface 57, as viewed from the third direction Y. The emitting part 58 is a portion of the second surface 57 that overlaps with the plurality of partial reflection surfaces 55 along the first direction X, and is a region having a predetermined width in the first direction X. Each of the plurality of partial reflection surfaces 55 includes a dielectric multilayer film provided in the light transmissive member.

At least one of the plurality of partial reflection surfaces 55 may be a composite film including a dielectric multilayer film and a reflective metal layer (thin film) mainly made of aluminum, silver, magnesium, chrome, or the like. When the partial reflection surface 55 includes a metal layer, it is possible to obtain an effect of enhancing the reflectance of the partial reflection surface 55, or to obtain an effect of optimizing the incident angle dependence or the polarization dependence of the transmittance and the reflectance of the partial reflection surface 55. Note that the emitting part 58 may include an optical element such as a diffraction grating or a hologram.

Configuration of Optical Device

Figure 4:
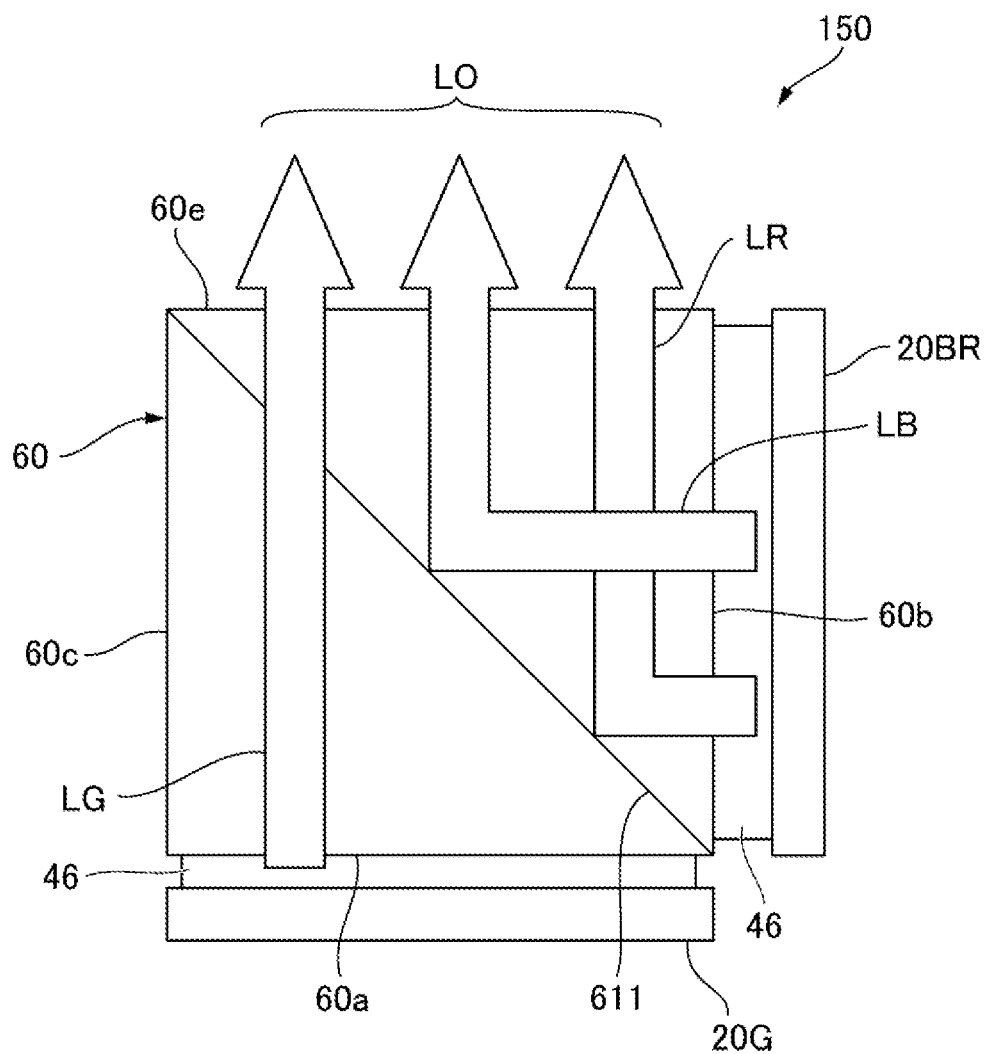
FIG. 4 is schematic configuration diagram of an optical module according to the first embodiment.
Figure 5:
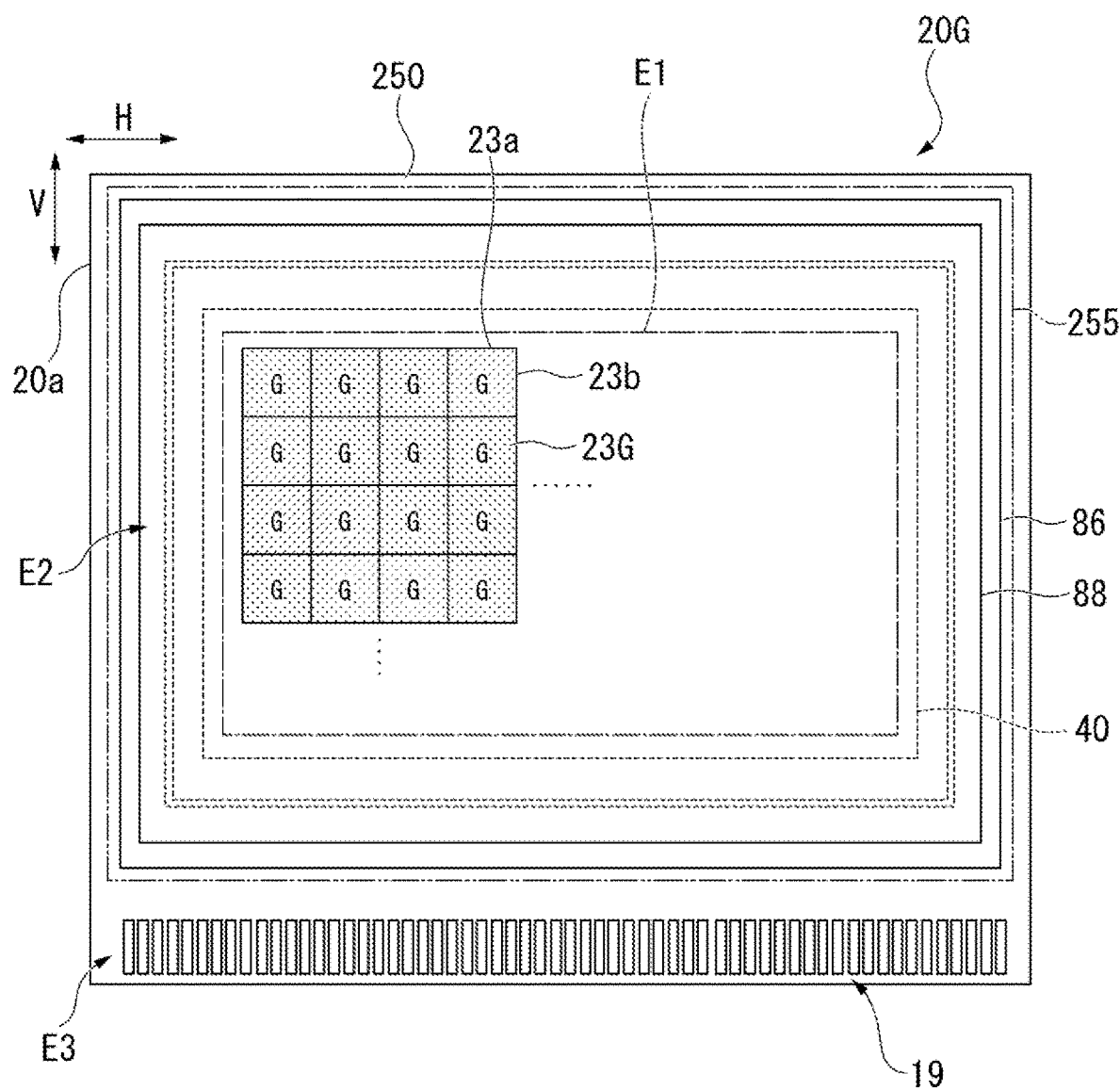
FIG. 5 is a front view illustrating a pixel arrangement of a first panel.
Figure 6:
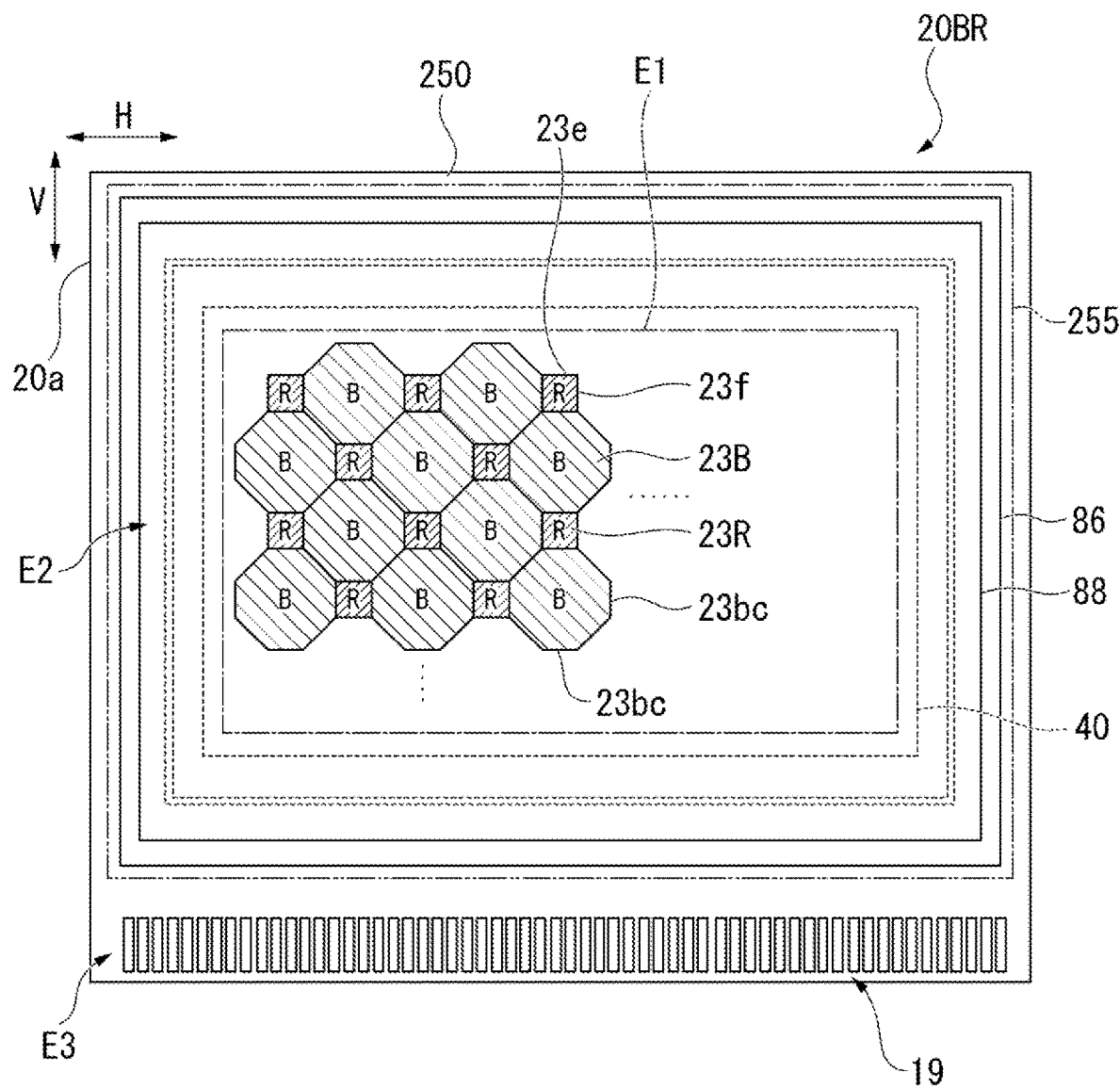
FIG. 6 is a front view illustrating a pixel arrangement of a second panel.

FIG. 4 is a schematic view of the optical module 150 illustrated in FIGS. 2 and 3 as viewed from the third direction Y. FIG. 5 is a front view illustrating an arrangement of a plurality of first pixels 23G in the first panel 20G. FIG. 6 is a front view illustrating an arrangement of a plurality of second pixels 23B and a plurality of third pixels 23R in the second panel 20BR. Note that each of the pixels illustrated in FIGS. 5 and 6 actually has a light emitting portion and a non-light emitting portion, which will be described later, but the light emitting portion and non-light emitting portion are not illustrated in FIGS. 5 and 6.

As illustrated in FIG. 4, the optical module 150 includes the first panel 20G, the second panel 20BR, and the prism 60. The first panel 20G is bonded to a first incident surface 60a of the prism 60 with a light-transmitting adhesive layer 46 therebetween. The second panel 20BR is bonded to a second incident surface 60b of the prism 60 with a light-transmitting adhesive layer 46 therebetween.

The first panel 20G and the second panel 20BR of the embodiment are examples of the electro-optical device according to the present disclosure.

As illustrated in FIG. 5, the first panel 20G includes the plurality of first pixels 23G. Each of the plurality of first pixels 23G includes a first light-emitting element (not illustrated) that emits a first light. The first light is light in which the peak wavelength in the spectrum includes the green wavelength region of, for example, 500 nm to 580 nm. Thus, the first panel 20G emits a green first image light LG that includes a plurality of first lights emitted from the plurality of first pixels 23G.

As illustrated in FIG. 6, the second panel 20BR includes the plurality of second pixels 23B and the plurality of third pixels 23R. Each of the plurality of second pixels 23B includes a second light-emitting element that emits a second light. Each of the plurality of third pixels 23R includes a third light-emitting element that emits a third light. The second light is light in which the peak wavelength in the spectrum includes the blue wavelength region of, for example, 400 nm to 500 nm. The third light is light in which the peak wavelength in the spectrum includes the red wavelength region of, for example, 580 nm to 780 nm. Thus, the second panel 20BR emits a blue second image light LB that includes a plurality of second lights emitted from the plurality of second pixels 23B and a red third image light LR that includes a plurality of third lights emitted from the plurality of third pixels 23R.

As illustrated in FIG. 4, the prism 60 is a dichroic prism. The dichroic prism includes a dichroic mirror 611 oriented obliquely to an emission surface of the first panel 20G and an emission surface of the second panel 20BR. The prism 60 has an emission surface 60e facing the projection optical device 70, the first incident surface 60a parallel to the emission surface 60e, the second incident surface 60b orthogonal to the emission surface 60e and the first incident surface 60a, and a side surface 60c parallel to the second incident surface 60b. When viewed from the third direction Y, the dichroic mirror 611 is formed along a diagonal line coupling a corner where the emission surface 60e and the side surface 60c are in contact with each other and a corner where the first incident surface 60a and the second incident surface 60b are in contact with each other.

The first panel 20G is disposed so as to face the first incident surface 60a. The second panel 20BR is disposed so as to face the second incident surface 60b. The dichroic mirror 611 has characteristics of transmitting light in the green wavelength region and reflecting light in the blue wavelength region and the red wavelength region. Due to these characteristics, the dichroic mirror 611 transmits the first image light LG emitted from the first panel 20G to emit the first image light LG through the emission surface 60e, and reflects the second image light LB and the third image light LR emitted from the second panel 20BR to emit the second image light LB and the third image light LR through the emission surface 60e.

In this way, the prism 60 synthesizes the green first image light LG emitted from the first panel 20G, the blue second image light LB emitted from the second panel 20BR, and the red third image light LR emitted from the second panel 20BR. The synthesized light LO in which the first image light LG, the second image light LB, and the third image light LR are synthesized is emitted from the emission surface 60e of the prism 60 toward the projection optical device 70.

Note that the dichroic mirror 611 may have a configuration contrary to the above-described configuration. In other words, the dichroic mirror 611 may reflect the first image light LG emitted from the first panel 20G and transmit the second image light LB and the third image light LR emitted from the second display panel 20BR. Also in this configuration, the dichroic mirror 611 can synthesize the first image light LG, the second image light LB, and the third image light LR. In this case, the synthesized light LO is emitted from the side surface 60c of the dichroic prism 61.

In the following description, the right-left direction in the first panel 20G and the second panel 20BR in FIGS. 5 and 6 is a direction in which scanning lines extend in an image generation region E1, and is referred to as a horizontal direction H. On the other hand, the up-down direction in the first panel 20G and the second panel 20BR is a direction in which data lines extend in the image generation region E1, and is referred to as a vertical direction V.

The horizontal direction H corresponds to a first direction D1 in a synthesized image D, which will be described later. The vertical direction V corresponds to a second direction D2 in the synthesized image D, which will be described later.

As illustrated in FIGS. 5 and 6, the first panel 20G and the second panel 20BR each have the image generation region E1 and a non-image generation region E2. The image generation region E1 is a region for generating an image by controlling the light emission/non-light emission in an organic layer in each of the plurality of pixels 23G, 23B, and 23R. The image generation region E1 is a rectangular region in which the plurality of pixels, 23G, 23B, and 23R are arranged in a matrix. Each of light-emitting elements, which will be described later, is covered with a sealing layer 88 and a counter substrate 86.

The non-image generation region E2 is a rectangular frame-shaped region surrounding the image generation region E1. In other words, the non-image generation region E2 is a region in which image light is not emitted. That is, the non-image generation region E2 is, in the first panel 20G, a region from the outer edge of the image generation region E1 to the outer edge of the first panel 20G, and in the second panel 20BR, a region from the outer edge of the image generation region E1 to the outer edge of the second panel 20BR. The non-image generation region E2 corresponds to a frame region of the first panel 20G and a frame region of the second panel 20BR. The non-image generation region E2 includes a mounting region E3.

A plurality of mounting terminals 19 are provided in the mounting region E3. Control signals and power supply potential are supplied to the mounting terminals 19 from various external circuits such as a control circuit and a power supply circuit, which are not illustrated. The external circuits are mounted on a flexible wiring substrate (not illustrated) bonded to the mounting region E3, for example.

As illustrated in FIG. 5, the first panel 20G includes the plurality of first pixels 23G, each of which emits the first light having the green wavelength region. The shape of the first pixel 23G is a square. The first pixel 23G is disposed so that a first side 23a of the square is parallel to the horizontal direction H, and a second side 23b of the square orthogonal to the first side 23a is parallel to the vertical direction V. The plurality of first pixels 23G are arranged in a matrix along both the horizontal direction H and the vertical direction V.

As illustrated in FIG. 6, the second panel 20BR includes the plurality of second pixels 23B, each of which emits the second light having the blue wavelength region and the plurality of third pixels 23R, each of which emits the third light having the red wavelength region.

The shape of the second pixel 23B is an octagon. In other words, when a square is arranged so that each side makes an angle of 45° with the horizontal direction H and the vertical direction V, the second pixel 23B has a shape in which four corners of the square are cut off by straight lines parallel to either the horizontal direction H or the vertical direction V. Hereinafter, each of the four parts created by cutting off the four corners of the square is referred to as a corner cut part. That is, the second pixel 23B has four corner cut parts 23bc.

The shape of the third pixel 23R is a square. The third pixel 23R is disposed so that a first side 23e of the square is parallel to the horizontal direction H, and a second side 23f of the square orthogonal to the first side 23e is parallel to the vertical direction V.

In the image generation region E1 in the second panel 20BR, the plurality of second pixels 23B are arranged adjacent to each other in a direction making an angle of 45° to both the horizontal direction H and the vertical direction V so that the oblique sides of the octagon, which is the shape of the second pixel 23B, are in contact with each other. In contrast, each of the plurality of third pixels 23R is arranged in a region surrounded by the respective corner cut parts 23bc of the four second pixels 23B adjacent to the third pixel 23R. Thus, in the image generation region E1, the plurality of pixels in the top row are arranged in the order of, for example, the third pixel 23R, the second pixel 23B, the third pixel 23R, the second pixel 23B . . . from the left end, and the plurality of pixels in the second row from the top are arranged in the order of, for example, the second pixel 23B, the third pixel 23R, the second pixel 23B, the third pixel 23R . . . from the left end, and the sequence is repeated thereafter. In other words, the plurality of second pixels 23B and the plurality of third pixels 23R are alternately arranged along the horizontal direction H and the vertical direction V.

Figure 7:
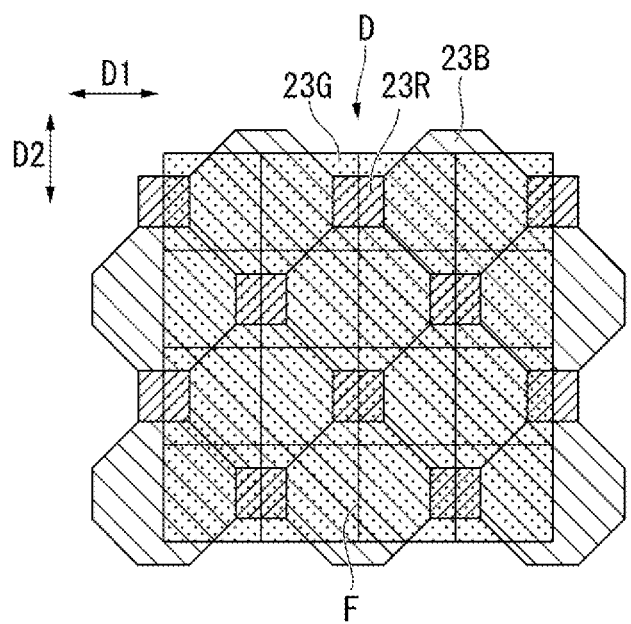
FIG. 7 is a diagram illustrating a superimposed state of pixels in a synthesized image.

FIG. 7 is a diagram illustrating a superimposed state of the pixels 23G, 23B, and 23R in the synthesized image D.

The synthesized light LO emitted from the prism 60 forms the synthesized image D as illustrated in FIG. 7. The right-left direction in FIG. 7 is referred to as the first direction D1 in the synthesized image D, and the up-down direction in FIG. 7 is referred to as the second direction D2 in the synthesized image D. In the synthesized image D, the image of the first panel 20G and the image of the second panel 20BR are arranged such that a portion of each of the two first pixels 23G adjacent to each other in the first direction D1 overlaps with one third pixel 23R. In other words, the image of the first panel 20G and the image of the second panel 20BR are arranged such that a boundary F of the two first pixels 23G adjacent to each other in the first direction D1 is located on one third pixel 23R.

Figure 8:
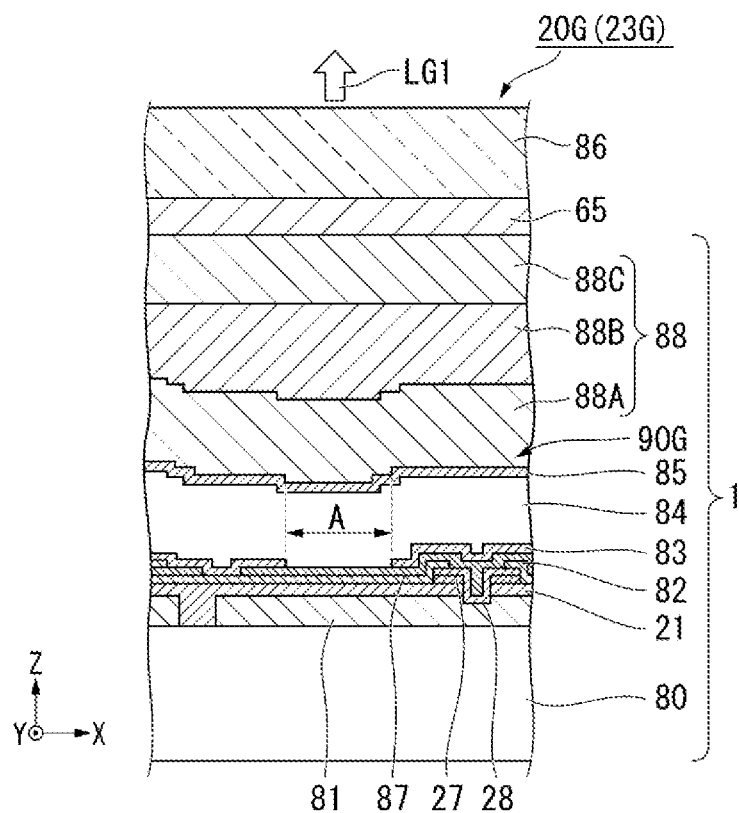
FIG. 8 is a cross-sectional view of each panel.

FIG. 8 is a cross-sectional view of the first panel 20G. Since the cross-sectional configuration of the panel is common to the first panel 20G and the second panel 20BR, the cross-sectional configuration of the panel will be described here as represented by the first panel 20G. The first panel 20G is a top emission organic EL device.

As illustrated in FIG. 8, the first panel 20G includes a substrate 80, a reflective layer 81, an insulating layer 21, a contact electrode 28, an insulating layer 27, a light-transmissive layer 87, a pixel electrode 82, an insulating layer 83, an organic layer 84, a common electrode 85, the sealing layer 88, a bonding material 65, and the counter substrate 86. A first light-emitting element 90G that emits the first light LG1 includes the pixel electrode 82, the organic layer 84, and the common electrode 85. In addition, an element substrate 1 includes the substrate 80, the reflective layer 81, the insulating layer 21, the light-transmissive layer 87, the pixel electrode 82, the insulating layer 83, the organic layer 84, the common electrode 85, and the sealing layer 88.

The reflective layer 81 is provided at the substrate 80 and is formed of a material having a high light reflectance patterned for each pixel. Examples of the constituent material of the reflective layer 81 include aluminum, silver, and alloys containing these materials. Of the light emitted from the organic layer 84, the reflective layer 81 reflects the first light LG1, which passes through the pixel electrode 82 and is emitted to the substrate 80 side, to emit the emitted first light LG1 toward the common electrode 85 side. Note that the reflective layer 81 may not be patterned for each pixel and may be formed at the entire substrate 80.

The insulating layer 21 is disposed at the reflective layer 81 and fills spaces between the plurality of reflective layers 81. The insulating layer 21 is formed of, for example, a silicon nitride (SiN) film. The insulating layer 21 is formed of, for example, a plurality of layers.

A plurality of contact electrodes 28 are provided at the insulating layer 21. The contact electrode 28 is provided for each light-emitting element. The contact electrode 28 electrically couples a pixel circuit including a transistor for causing the light-emitting element to emit light, to the pixel electrode 82. The insulating layer 27 made of an insulating material such as silicon oxide is provided between the contact electrode 28 and the insulating layer 21. The contact electrode 28 is made of a conductive material such as tungsten (W), titanium (Ti), or titanium nitride (TiN).

The light-transmissive layer 87 is provided at the insulating layer 21. The light-transmissive layer 87 is formed of a plurality of films having insulating properties. Examples of the material of the light-transmissive layer 87 include silicon-based inorganic materials such as silicon oxide and silicon nitride.

The pixel electrode 82 is made of a light-transmissive material patterned for each pixel. Examples of the constituent material of the pixel electrode 82 include a transparent conductive material such as indium tin oxide (ITO). The pixel electrode 82 is supplied with a drive current from a power source line via a drive transistor (not illustrated), and functions as an anode. The two pixel electrodes 82 adjacent to each other are insulated by the insulating layer 83.

The insulating layer 83 having a plurality of openings is disposed at the light-transmissive layer 87. The insulating layer 83 covers the respective outer edges of the plurality of pixel electrodes 82. The plurality of pixel electrodes 82 are electrically insulated from each other by the insulating layer 83. The plurality of openings in the insulating layer 83 define a plurality of light emitting portions A. The light emitting portion may also be defined as a region where the organic layer 84 and the pixel electrode 82 are in contact with each other. Examples of the material of the insulating layer 83 include silicon-based inorganic materials such as silicon oxide and silicon nitride.

The organic layer 84 is formed so as to be in contact with the insulating layer 83 and the pixel electrodes 82 exposed through the openings in the insulating layer 83. The organic layer 84 has a configuration in which, for example, a hole injection layer, a hole transport layer, a green light-emitting layer, and an electron injection layer are layered in order from the side of the pixel electrode 82, and emits the first light LG1. Note that the organic layer 84 is not limited to the configuration described above, but may have other configuration, such as a configuration in which the hole injection layer and the hole transport layer are combined as a single layer or a configuration in which the organic layer serves as all functional layers.

The common electrode 85 is made of a translucent and reflective material and is formed over the entire organic layer 84. The common electrode 85 functions as a cathode. The common electrode 85 is formed of, for example, a metal material formed thin enough to allow part of the first light LG1 to pass through or a material having both light-transmissive and light-reflective properties. Due to this, the first light LG1 emitted from the organic layer 84 and reflected by the reflective layer 81 passes through the pixel electrode 82 and is incident on the common electrode 85, and part of the first light LG1, which is incident on the common electrode 85, is reflected toward the pixel electrode 82 and is again reflected by the reflective layer 81.

As a result, light having a wavelength corresponding to an optical path length between the reflective layer 81 and the common electrode 85 resonates between the reflective layer 81 and the common electrode 85, and the resonated light is emitted from the common electrode 85. For example, the optical path length of the first pixel 23G in the first panel 20G is set so that light in the green wavelength region resonates, the optical path length of the second pixel 23B in the second panel 20BR is set so that light in the blue wavelength region resonates, and the optical path length of the third pixel 23R in the second panel 20BR is set so that light in the red wavelength region resonates. Note that the optical path lengths of the pixels do not necessarily need to be different from each other. For example, the optical path lengths of the first pixel 23G, the second pixel 23B, and the third pixel 23R may be the same. Alternatively, the panels 20G and 20BR may not have a configuration in which light resonates as described above.

The sealing layer 88 is provided at the plurality of first light-emitting elements 90G. The sealing layer 88 protects the plurality of first light-emitting elements 90G. Specifically, the sealing layer 88 seals the plurality of first light-emitting elements 90G in order to protect the plurality of first light-emitting elements 90G from the external environment. The sealing layer 88 has gas barrier properties, and protects the first light-emitting elements 90G from, for example, external moisture or oxygen. When the sealing layer 88 is provided, deterioration of the first light-emitting elements 90G can be suppressed compared to a case in which the sealing layer 88 is not provided. Therefore, the quality reliability of the first panel 20G can be improved. The sealing layer 88 is light-transmissive.

The sealing layer 88 includes a first sealing layer 88A, a second sealing layer 88B, and a third sealing layer 88C. The first sealing layer 88A, the second sealing layer 88B, and the third sealing layer 88C are layered at the substrate 80 in this order. The first sealing layer 88A, the second sealing layer 88B, and the third sealing layer 88C have light-transmissive and insulating properties. The first sealing layer 88A and the third sealing layer 88C are made of an inorganic material such as silicon oxynitride (SiON). The second sealing layer 88B is a planarization layer for providing a flat surface to the third sealing layer 88C. The second sealing layer 88B is made of a resin such as an epoxy resin or an inorganic material such as aluminum oxide ($Al_2O_3$). Note that the sealing layer 88 of the embodiment has three layers, but may have one, two, or four or more layers.

The counter substrate 86 protects the light emitting portion A of the element substrate 1. The counter substrate 86 is formed of, for example, a glass substrate or a quartz substrate. The bonding material 65 bonds the element substrate 1 and the counter substrate 86. The bonding material 65 is formed of, for example, an epoxy-based adhesive or an acrylic-based adhesive.

Note that a color filter having a color corresponding to the emission color of each pixel in each panel may be provided between the sealing layer 88 and the counter substrate 86.

The cross-sectional configuration of the first panel 20G has been described above, and the cross-sectional configuration of the second panel 20BR is similar to the cross-sectional configuration of the first panel 20G. However, the organic layer 84 corresponding to the second pixel 23B includes a blue light-emitting layer, and the organic layer 84 corresponding to the third pixel 23R includes a red light-emitting layer. Thus, in each of the pixels 23G, 23B, and 23R, the light emitted from each light-emitting element of the pixel is emitted outside the panel through the counter substrate 86. Accordingly, in each of the pixels 23G, 23B, and 23R, the region where the light emitted from each light-emitting element is emitted outside the panel is a region overlapping each of light emitting portions 23G1, 23B1, and 23R1 (light emitting portion A illustrated in FIG. 8) corresponding to the opening in the insulating layer 83 when viewed from the normal direction of the substrate 80. Conversely, when viewed from the normal direction of the substrate 80, the regions overlapping the insulating layer 83 are non-light emitting portions 23G2, 23B2, and 23R2 in which the light emitted from each light-emitting element is not emitted outside the panel.

Hereinafter, an example of a specific configuration of each of the pixels 23G, 23B, and 23R in each panel will be described with reference to FIGS. 9 and 10.

Figure 9:
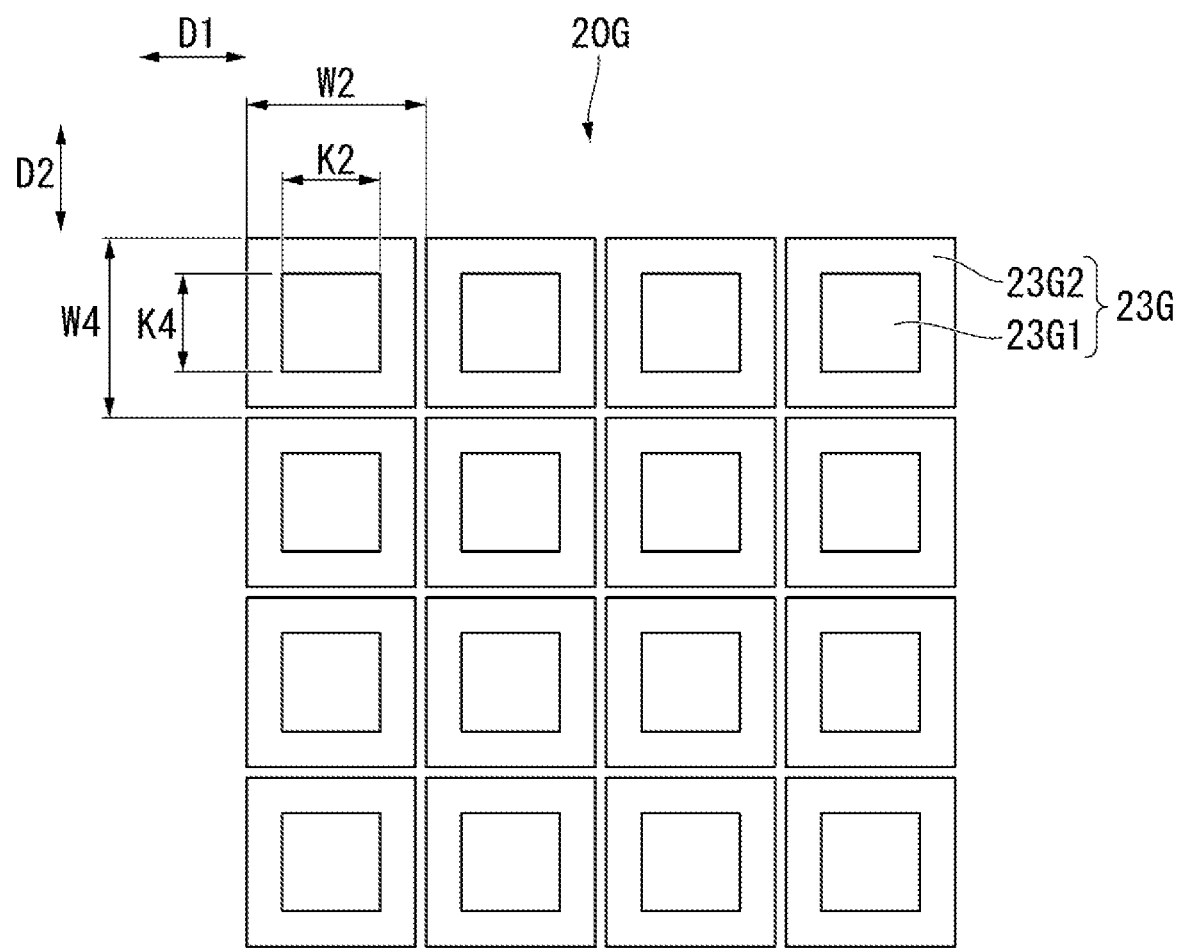
FIG. 9 is a plan view illustrating a specific example of an arrangement of first pixels in the first panel.

FIG. 9 is a plan view illustrating a specific example of the arrangement of the first pixels 23G in the first panel 20G. FIG. 10 is a plan view illustrating a specific example of the arrangement of the second pixels 23B and the third pixels 23R in the second panel 20BR.

In the following description, the view of each panel from the normal direction of the substrate 80 of the panel is referred to as a plan view, and the shape of each component viewed from the normal direction of the substrate 80 of the panel is referred to as a planar shape. In addition, the right-left direction in FIGS. 9 and 10 corresponds to the extending direction of the top side and the bottom side of the square pixel, and corresponds to the first direction D1 in the synthesized image D. The up-down direction in FIGS. 9 and 10 corresponds to the extending direction of the right side and the left side of the square pixel, and corresponds to the second direction D2 in the synthesized image D.

Hereinafter, in each of the pixels 23G, 23B, and 23R, a region overlapping the opening in the insulating layer 83 when viewed from the normal direction of the substrate 80 is defined as a light emitting portion, and in the region in which the pixel electrode 82 is formed, a region overlapping the insulating layer 83 is defined as a non-light emitting portion.

As illustrated in FIG. 9, in the first panel 20G, the first pixel 23G has the first light emitting portion 23G1 and the first non-light emitting portion 23G2 surrounding the first light emitting portion 23G1. The planar shape and dimensions of the first light emitting portion 23G1 are defined by the opening in the insulating layer 83. The planar shape of the first light emitting portion 23G1 is a square similar to the planar shape of the first pixel 23G. In the case of the embodiment, the center position of the square forming the planar shape of the first light emitting portion 23G1 coincides with the center position of the square forming the planar shape of the first pixel 23G, but may not necessarily coincide.

Figure 10:
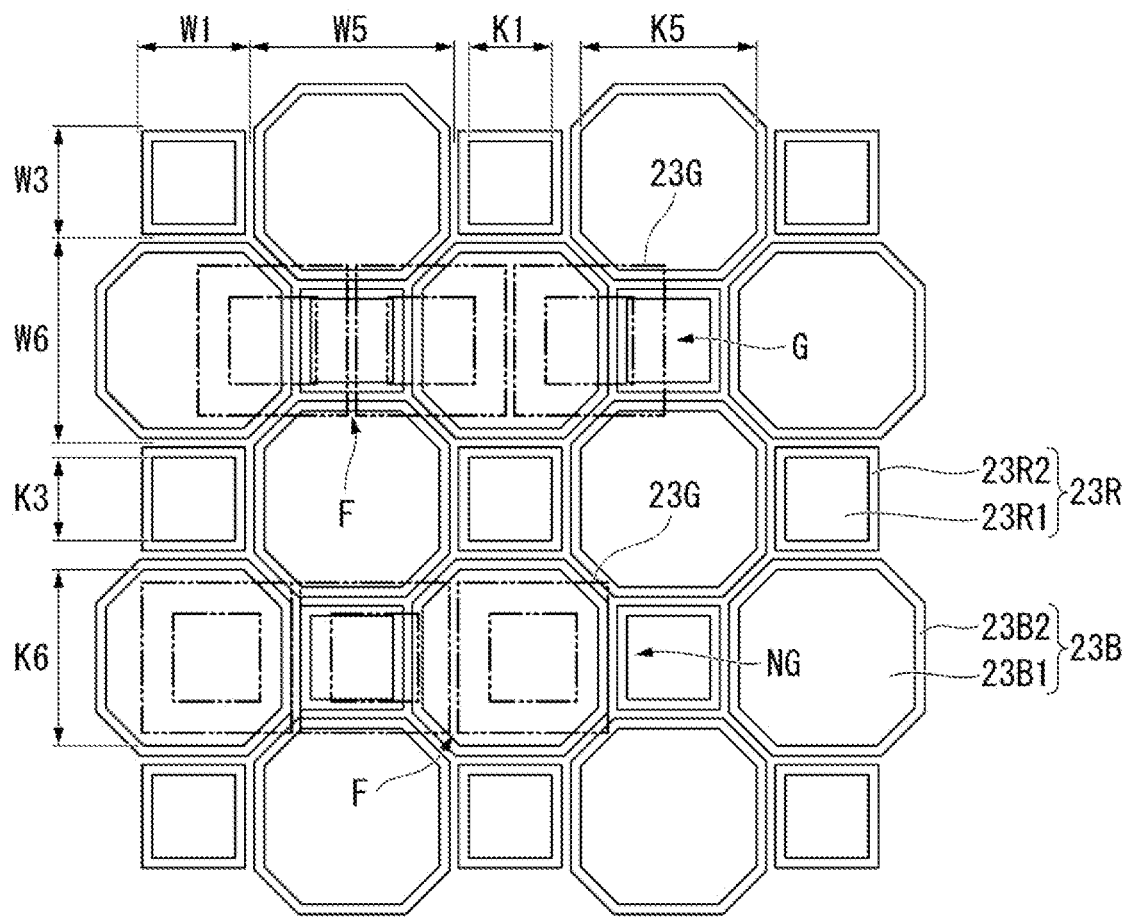
FIG. 10 is a plan view illustrating a specific example of an arrangement of second pixels and third pixels in the second panel.

As illustrated in FIG. 10, in the second panel 20BR, the second pixel 23B includes the second light emitting portion 23B1 and the second non-light emitting portion 23B2 surrounding the second light emitting portion 23B1. The planar shape and dimensions of the second light emitting portion 23B1 are defined by the opening in the insulating layer 83. The planar shape of the second light emitting portion 23B1 is an octagon similar to the planar shape of the second pixel 23B. In the case of the embodiment, the center position of the octagon forming the planar shape of the second light emitting portion 23B1 coincides with the center position of the octagon forming the planar shape of the second pixel 23B, but may not necessarily coincide.

The third pixel 23R includes the third light emitting portion 23R1 and the third non-light emitting portion 23R2 surrounding the third light emitting portion 23R1. The planar shape and dimensions of the third light emitting portion 23R1 are defined by the opening in the insulating layer 83. The planar shape of the third light emitting portion 23R1 is a square similar to the planar shape of the third pixel 23R. In the case of the embodiment, the center position of the square forming the planar shape of the third light emitting portion 23R1 coincides with the center position of the square forming the planar shape of the third pixel 23R, but may not necessarily coincide.

In the embodiment, the planar shape and dimensions of each of the light emitting portions 23G1, 23B1, and 23R1 are defined by the opening in the insulating layer 83, but may not necessarily be defined by the opening in the insulating layer 83. That is, each panel may not include the insulating layer 83, and the planar shape and dimensions of each of the light emitting portions 23G1, 23B1, and 23R1 may be defined by, for example, a region in which the pixel electrode 82 and the organic layer 84 are in contact with each other. When the insulating layer 83 described above is not provided, it is assumed that the region where the pixel electrode is formed is the light emitting portion and the pixel has only the light emitting portion.

Hereinafter, the results of an examination by the inventors on the relationship between the dimensions of the first pixel, the second pixel, and the third pixel will be described.

For example, in a panel used as a micro display, a typical pixel size is considered to be approximately 4 μm to 10 μm. In the manufacturing process of optical modules, the maximum allowable range of misalignment when bonding the panel to the prism is approximately 2 μm to 5 μm, assuming that the allowable range is approximately half the size of the pixel. In contrast, in the current manufacturing technology of optical modules, the competent value for misalignment is approximately 1 μm.

In the embodiment, of the pixels in the second panel 20BR, the third pixel 23R that emits red light has smaller area than the second pixel 23B that emits blue light. In this case, it is desirable that both a first width W1 of the third pixel 23R corresponding to the first direction D1 in the synthesized image D and a third width W3 of the third pixel 23R corresponding to the second direction D2 in the synthesized image D be greater than twice the competent value of the misalignment. Thus, the first width W1 and the third width W3 of the third pixel 23R are set to, for example, 2.7 μm. It is desirable that the first width W1 of the third pixel 23R be 0.5 times to twice the third width W3 of the third pixel 23R.

Next, in the embodiment, the area of the third pixel 23R that emits red light is smaller than the area of the first pixel 23G that emits green light in the first panel 20G. In this case, the first width W1 of the third pixel 23R is not less than 0.5 times and less than 1 time a second width W2 of the first pixel 23G corresponding to the first direction D1 in the synthesized image D. Further, the third width W3 of the third pixel 23R is not less than 0.5 times and less than 1 time a fourth width W4 of the first pixel 23G corresponding to the second direction D2 in the synthesized image D. Thus, the second width W2 and the fourth width W4 of the first pixel 23G are set to, for example, 3.8 μm.

In addition, a fifth width W5 of the second pixel 23B corresponding to the first direction D1 in the synthesized image D and a sixth width W6 corresponding to the second direction D2 in the synthesized image D are set to, for example, 4.9 μm. Note that both the fifth width W5 and the sixth width W6 of the second pixel 23B may be appropriately set in accordance with the difference in the deterioration characteristics of the light-emitting element included in each pixel.

In each of the pixels 23G, 23B, and 23R, a ratio of the area of each of the light emitting portions 23G1, 23B1, and 23R1 to the area of each of the non-light emitting portions 23G2, 23B2, and 23R2 may be set appropriately. Therefore, the width of each of the light emitting portions 23G1, 23B1, and 23R1 can be set appropriately with the width of each of the pixels 23G, 23B, and 23R corresponding to each of the light emitting portions 23G1, 23B1, and 23R1, as the upper limit. In other words, when the width of each of the light emitting portions 23G1, 23B1, and 23R1 is widened to the upper limit, the shape of each of the pixels 23G, 23B, and 23R may be considered as each of the light emitting portions 23G1, 23B1, and 23R1.

Accordingly, the widths of the third light emitting portion 23R1 may be the width W1 and width W3, the widths of the first light emitting portion 23G1 may be the width W2 and the width W4, and the widths of the second light emitting portion may be the width W5 and the width W6.

In the embodiment, a first width K1 of the third light emitting portion 23R1 corresponding to the first direction D1 in the synthesized image D and a third width K3 of the third light emitting portion 23R1 corresponding to the second direction D2 in the synthesized image D are each set to 2.0 μm, for example. Further, a second width K2 of the first light emitting portion 23G1 corresponding to the first direction D1 in the synthesized image D and a fourth width K4 of the first light emitting portion 23G1 corresponding to the second direction D2 in the synthesized image D are each set to 2.0 μm, for example. Furthermore, a fifth width K5 of the second light emitting portion 23B1 corresponding to the first direction D1 in the synthesized image D and a sixth width K6 of the second light emitting portion 23B1 corresponding to the second direction D2 in the synthesized image D are each set to 4.2 μm, for example.

Regarding the area relationship between the light emitting portions 23G1, 23B1, and 23R1, it is desirable that the area of the second light emitting portion 23B1 be 1.5 times to 5 times the area of the third light emitting portion 23R1. Further, it is desirable that the area of the first light emitting portion 23G1 is 1 time to twice the area of the third light emitting portion 23R1. In addition, since the upper limit of the area of each of the light emitting portions 23G1, 23B1, and 23R1 corresponds to the area of each of the pixels 23G, 23B, and 23R, it is desirable that the area relationship between the pixels 23G, 23B, and 23R also be a similar to the above. That is, it is desirable that the area of the second pixel 23B be 1.5 times to 5 times the area of the third pixel 23R. Further, it is desirable that the area of the first pixel 23G be 1 time to twice the area of the third pixel 23R.

Effects of First Embodiment

As illustrated in reference sign G in FIG. 10, when there is no misalignment between the first panel 20G and the second panel 20BR, the boundary F of the two first pixels 23G adjacent to each other in the first direction D1 in the synthesized image D are arranged so that the boundary F passes through the center of the third pixel 23R. In this case, one first pixel 23G overlaps with one second pixel 23B and one third pixel 23R. In contrast, as illustrated in reference sign NG in FIG. 10, it is assumed that as a result of the misalignment between the first panel 20G and the second panel 20BR, the boundary F of the two first pixels 23G adjacent to each other in the first direction D1 in the synthesized image D is off the third pixel 23R and is positioned on the second pixel 23B. In this case, depending on the location, there is a first pixel 23G that overlaps both the second pixel 23B and the third pixel 23R, and there is a first pixel 23G that overlaps only the second pixel 23B. In this way, the overlapping status of the three pixels 23G, 23B, and 23R having the different light emission colors differs depending on the location. Therefore, when this optical module is used in an image display device, it causes discomfort to the viewer and deteriorates the display quality of the image.

To address this problem, the optical module 150 of the embodiment includes the first panel 20G including the first pixels 23G, the second panel 20BR including the second pixels 23B and the third pixels 23R, and the prism 60 that synthesizes the first image light LG emitted from the first panel 20G and the second image light LB and the third image light LR emitted from the second panel 20BR. The area of the second pixel 23B is larger than the area of the first pixel 23G, and the area of the third pixel 23R is smaller than the area of the second pixel 23B. The first width W1 of the third pixel 23R corresponding to the first direction D1 in the synthesized image D formed by the prism 60 is not less than 0.5 times and less than 1 time the second width W2 of the first pixel 23G corresponding to the first direction D1, and the third width W3 of the third pixel 23R corresponding to the second direction D2 in the synthesized image D is not less than 0.5 times and less than 1 time the fourth width W4 of the first pixel 23G corresponding to the second direction D2.

According to the optical module 150 of the embodiment, each width of the third pixel 23R and each width of the first pixel 23G are set so as to satisfy the above relationship. Thus, for example, even when a misalignment of 1 μm occurs along the first direction D1, the boundary F of the two first pixels 23G adjacent to each other in the first direction D1 is located on the third pixel 23R. Therefore, it is suppressed that the boundary F is placed at a position outside the third pixel 23R, as indicated by the reference sign NG in FIG. 10. Here, an example of the misalignment in the first direction D1 has been described, but it is similar for the misalignment in the second direction D2. As a result, when this optical module 150 is used in an image display device, the display quality of the image can be ensured while maintaining the lifespan of the light-emitting elements in each of the panels 20G and 20BR.

In the optical module 150 of the embodiment, since the planar shape of the third pixel 23R is square, the first width W1 of the third pixel 23R is one times the third width W3 of the third pixel 23R. It is desirable that the first width W1 of the third pixel 23R be 0.5 times to twice the third width W3 of the third pixel 23R. That is, the planar shape of the third pixel 23R may not necessarily be a square, but preferably a rectangle in which a ratio of the first width W1 to the third width W3 is close to 1. The acceptable range of the ratio of the first width W1 to the third width W3 is 0.5 or more and 2 or less.

According to the above-described configuration, when the optical module 150 is used in an image display device, the display quality of the image can be stably ensured. The reason will be described below.

Figure 13:
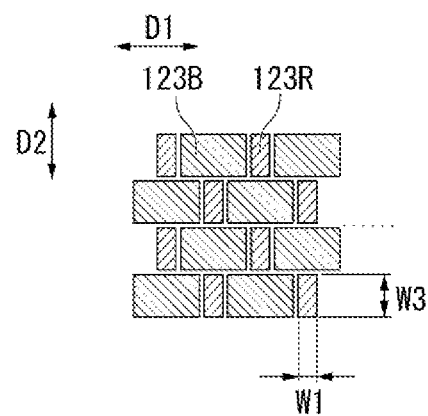
FIG. 13 is a diagram illustrating a pixel arrangement in a second panel according to a comparative example.
Figure 14:
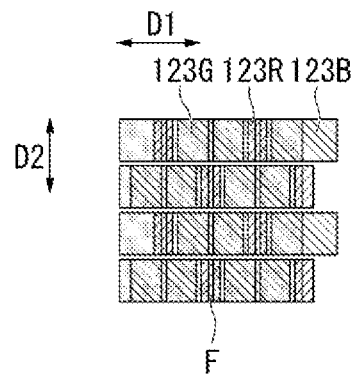
FIG. 14 is a diagram illustrating a superimposed state of pixels in a synthesized image of the comparative example.

FIG. 13 is a diagram illustrating a pixel arrangement of the second panel of a comparative example. FIG. 14 is a diagram illustrating a superimposed state of pixels in a synthesized image of the comparative example.

As illustrated in FIG. 13, in the second panel of the comparative example, the planar shapes of a second pixel 123B and a third pixel 123R are both rectangular, and the area of the third pixel 123R is smaller than the area of the second pixel 123B. In addition, the planar shape of the third pixel 123R is a rectangle elongated in the second direction D2 where a ratio of the first width W1 to the third width W3 exceeds 2. Although not illustrated, the planar shape of the first pixel in the first panel is a square.

As illustrated in FIG. 14, the superimposition of the respective pixels is such that the boundary F of two first pixels 123G adjacent to each other in the first direction D1 in the synthesized image D passes through the center of the third pixel 123R. However, in the case of the comparative example, the planar shape of the third pixel 123R is elongated in the second direction D2, and the first width W1 of the third pixel 123R is too small compared to the third width W3. Therefore, when misalignment occurs in the first direction D1, the boundary between the two first pixels 123G is likely to be off the third pixel 123R, and the positional relationship between the three pixels 123G, 123B, and 123R having different emission colors from each other is not likely to maintain the desired positional relationship.

In contrast, when the planar shape of the third pixel 23R is a quadrangle with the ratio of the first width W1 to the third width W3 of 0.5 or more and 2 or less as in the embodiment, the length of the short side can be made longer than the length of the short side of the third pixel 123R of the comparative example. With this configuration, according to the embodiment, a margin for misalignment of the pixels can be increased. As a result, the display quality of the image can be stably ensured.

Further, in the optical module 150 of the embodiment, the area of the second pixel 23B is 1.5 times to 5 times the area of the third pixel 23R, and the area of the first pixel 23G is 1 time to twice the area of the third pixel 23R.

According to this configuration, the current density for each of the pixels 23G, 23B, and 23R can be optimized individually, and the lifespan of each light-emitting element can be effectively maintained. The color balance of white light can also be optimized.

In the optical module 150 of the embodiment, the shape of the second pixel 23B is substantially octagonal, and the shape of the third pixel 23R is substantially square.

According to this configuration, in the second panel 20BR, the second pixels 23B, each of which has a relatively large area, and the third pixels 23R, each of which has a relatively small area, can be efficiently arranged.

Further, in the optical module 150 of the embodiment, the third pixel 23R is arranged in a region surrounded by the respective corner cut parts 23bc of the plurality of second pixels 23B adjacent to the third pixel 23R.

According to this configuration, the second pixels 23B and the third pixels 23R can be arranged without gaps.

The image display device 100 of the embodiment includes the optical module 150 described above, which provides excellent image display quality.

Second Embodiment

A second embodiment of the present disclosure will be described below with reference to FIGS. 11 and 12.

The configuration of the optical module of the second embodiment is similar to that of the first embodiment, but the configuration of a first panel is different from that of the first embodiment. Therefore, the overall configuration of the optical module will not be described.

Figure 11:
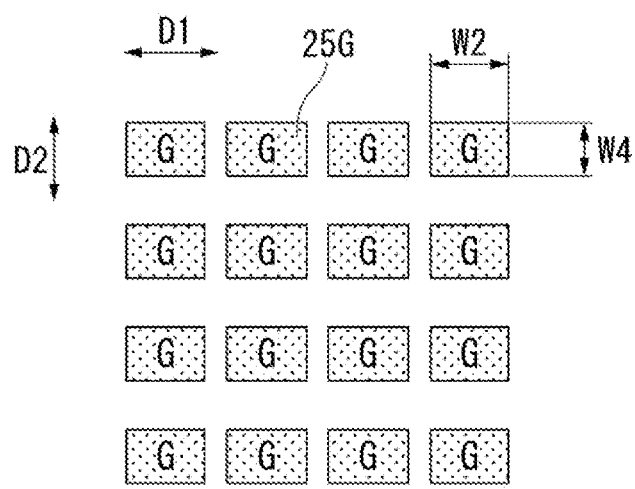
FIG. 11 is a diagram illustrating a pixel arrangement in the first panel according to a second embodiment.

FIG. 11 is a diagram illustrating a pixel arrangement of the first panel according to the embodiment. FIG. 12 is a diagram illustrating a superimposed state of pixels in a synthesized image.

Figure 12:
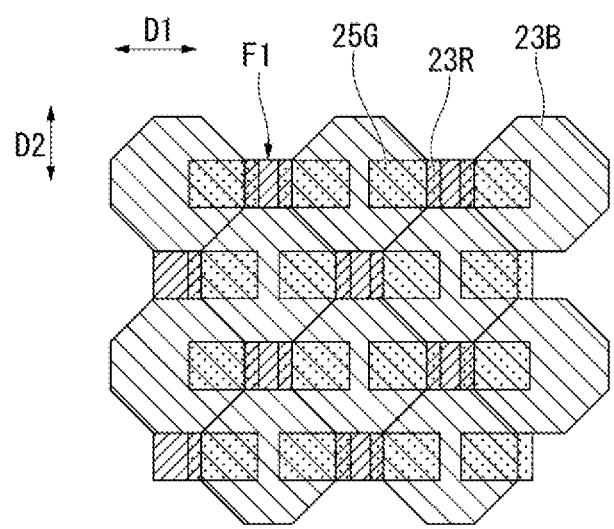
FIG. 12 is a diagram illustrating a superimposed state of pixels in a synthesized image.

In FIGS. 11 and 12, components common to those in the drawings for the first embodiment are denoted with the same reference signs, and description thereof will be omitted.

As illustrated in FIGS. 11 and 12, in the first panel of the embodiment, the planar shape of a first pixel 25G is a rectangle in which the second width W2 corresponding to the first direction D1 in the synthesized image D is longer than the fourth width W4 corresponding to the second direction D2. In this example, the boundary F1 of two first pixels 25G adjacent to each other in the first direction D1 in the synthesized image D is located on the third pixel 23R. Other configurations of the optical module are similar to those of the first embodiment.

Effects of Second Embodiment

The optical module of the embodiment also has similar effects to those of the first embodiment, such that the display quality of the image can be ensured while maintaining the lifespan of the light-emitting elements in each panel.

In addition, according to the optical module of the embodiment, the area of the first pixel 25G can be adjusted appropriately by changing the planar shape of the first pixel 25G from the square in the first embodiment to the rectangle. This allows the lifespan characteristics of the first light-emitting element to be aligned with the lifespan characteristics of the other light-emitting elements, and the color balance of the image to be adjusted by adjusting the amount of superimposition of the first pixel 25G to the other pixels 23B and 23R.

Note that the technical scope of the present disclosure is not limited to the above-described embodiments, and various modifications can be made to the above-described embodiments without departing from the spirit and gist of the present disclosure.

For example, in the first embodiment, the area of the first pixel that emits green light is larger than the area of the third pixel that emits red light, but the area of the first pixel may be smaller than the area of the third pixel, or may be the same as the area of the third pixel. In other words, the area of the first pixel may be 1 time to twice the area of the third pixel.

In the embodiments described above, the organic EL panel is used as an example as the first panel and the second panel, which are components of the optical module. However, the electro-optical device is not limited to the organic EL panel, and a self-emitting panel such as an inorganic EL panel or a micro-LED panel can also be used. The first panel and the second panel may not be self-emitting panels, and may be electro-optical devices such as liquid crystal panels.

Other examples of the image display device provided with the optical module described in the above embodiments include a head-up display, a handheld display, an electronic view finder (EVF) used in an imaging device such as a video camera or a still camera, and a projector.

Specific descriptions regarding the number, shape, arrangement, constituent material, and the like of each component of the optical module and image display device in the above-mentioned embodiments are not limited to those in the above-mentioned embodiments, and may be suitably changed.

An optical module according to one aspect of the present disclosure may have the following configuration.

The optical module according to the one aspect of the present disclosure includes a first electro-optical device including a first pixel configured to emit light having a first wavelength region, a second electro-optical device including a second pixel configured to emit light having a second wavelength region and a third pixel configured to emit light having a third wavelength region, and a prism configured to synthesize image light emitted from the first electro-optical device and image light emitted from the second electro-optical device, in which an area of the second pixel is larger than an area of the first pixel and an area of the third pixel is smaller than the area of the second pixel, and a first width of the third pixel corresponding to a first direction in a synthesized image formed by the prism is not less than 0.5 times and less than 1 time a second width of the first pixel corresponding to the first direction, and a third width of the third pixel corresponding to a second direction intersecting the first direction in the synthesized image is not less than 0.5 times and less than 1 time a fourth width of the first pixel corresponding to the second direction.

In the optical module according to the one aspect of the present disclosure, the first width of the third pixel may be 0.5 times to twice the third width of the third pixel.

In the optical module according to the one aspect of the present disclosure, the area of the second pixel may be 1.5 times to 5 times the area of the third pixel, and the area of the first pixel may be 1 time to twice the area of the third pixel.

In the optical module according to the one aspect of the present disclosure, a shape of the second pixel may be substantially octagonal, and a shape of the third pixel may be substantially square.

In the optical module according to the one aspect of the present disclosure, the third pixel of the second electro-optical device may be arranged in a region surrounded by corner cut parts of a plurality of the second pixels adjacent to the third pixel.

An image display device according to another aspect of the present disclosure may have the following configuration.

The image display device according to the other aspect of the present disclosure includes the optical module according to the one aspect of the present disclosure.

What is claimed is:

1. An optical module comprising:
   a first electro-optical device including a first pixel configured to emit light having a first wavelength region;
   a second electro-optical device including a second pixel configured to emit light having a second wavelength region and a third pixel configured to emit light having a third wavelength region; and
   a prism configured to synthesize image light emitted from the first electro-optical device and image light emitted from the second electro-optical device, wherein
   an area of the second pixel is larger than an area of the first pixel, and an area of the third pixel is smaller than the area of the second pixel, and
   a first width of the third pixel in a direction corresponding to a first direction in a synthesized image formed by the prism is not less than 0.5 times and less than 1 time a second width of the first pixel in the direction corresponding to the first direction, and a third width of the third pixel in a direction corresponding to a second direction intersecting the first direction in the synthesized image is not less than 0.5 times and less than 1 time a fourth width of the first pixel in the direction corresponding to the second direction,
   wherein the first pixel has a first light emitting portion and a first non-light emitting portion surrounding the first light emitting portion, the second pixel has a second light emitting portion and a second non-light emitting portion surrounding the second light emitting portion, and the third pixel has a third light emitting portion and a third non-light emitting portion surrounding the third light emitting portion,
   wherein an area of the second light emitting portion is 1.5 times to 5 times an area of the third light emitting portion, and an area of the first light emitting portion is 1 time to twice the area of the third light emitting portion.

2. The optical module according to claim 1, wherein the first width of the third pixel is 0.5 times to twice the third width of the third pixel.

3. The optical module according to claim 2, wherein
   the area of the second pixel is 1.5 times to 5 times the area of the third pixel, and
   the area of the first pixel is 1 time to twice the area of the third pixel.

4. The optical module according to claim 3, wherein
   a shape of the second pixel is substantially octagonal, and
   a shape of the third pixel is substantially square.

5. The optical module according to claim 4, wherein in the second electro-optical device, the third pixel is arranged in a region surrounded by corner cut parts of a plurality of the second pixels adjacent to the third pixel.

6. The optical module according to claim 2, wherein
   a shape of the second pixel is substantially octagonal, and
   a shape of the third pixel is substantially square.

7. The optical module according to claim 6, wherein in the second electro-optical device, the third pixel is arranged in a region surrounded by corner cut parts of a plurality of the second pixels adjacent to the third pixel.

8. The optical module according to claim 1, wherein
   the area of the second pixel is 1.5 times to 5 times the area of the third pixel, and
   the area of the first pixel is 1 time to twice the area of the third pixel.

9. The optical module according to claim 8, wherein
   a shape of the second pixel is substantially octagonal, and
   a shape of the third pixel is substantially square.

10. The optical module according to claim 9, wherein in the second electro-optical device, the third pixel is arranged in a region surrounded by corner cut parts of a plurality of the second pixels adjacent to the third pixel.

11. The optical module according to claim 1, wherein
    a shape of the second pixel is substantially octagonal, and
    a shape of the third pixel is substantially square.

12. The optical module according to claim 11, wherein in the second electro-optical device, the third pixel s arranged in a region surrounded by corner cut parts of a plurality of the second pixels adjacent to the third pixel.

13. An image display device comprising the optical module according to claim 1.

* * * * *